United States Patent
Hall et al.

(10) Patent No.: US 8,314,608 B2
(45) Date of Patent: Nov. 20, 2012

(54) METHOD OF DETERMINING DISTANCE TO A FERROUS MATERIAL

(76) Inventors: David R. Hall, Provo, UT (US); David C. Wahlquist, Spanish Fork, UT (US); Huntington Tracy Hall, Provo, UT (US)

( * ) Notice: Subject to any disclaimer, the term of this patent is extended or adjusted under 35 U.S.C. 154(b) by 268 days.

(21) Appl. No.: 12/827,525

(22) Filed: Jun. 30, 2010

(65) Prior Publication Data

US 2012/0001621 A1 Jan. 5, 2012

(51) Int. Cl.
*G01B 7/14* (2006.01)

(52) U.S. Cl. ......... 324/207.13; 324/207.15; 324/207.16; 702/104

(58) Field of Classification Search ............. 324/207.13, 324/207.15, 207.16; 702/104
See application file for complete search history.

(56) References Cited

U.S. PATENT DOCUMENTS

| | | | |
|---|---|---|---|
| 3,764,223 A | 10/1973 | Lucero et al. |
| 3,767,264 A | 10/1973 | Eckey |
| 3,996,510 A | 12/1976 | Guichard |
| 4,075,553 A | 2/1978 | Bouverot et al. |
| 4,103,973 A | 8/1978 | Cutler |
| 4,322,937 A | 4/1982 | Hollmann |
| 4,507,612 A | 3/1985 | Payne |
| 4,961,173 A | 10/1990 | Sehr et al. |
| 5,119,028 A | 6/1992 | Mooney et al. |
| 5,122,744 A | 6/1992 | Koch |
| 5,195,841 A | 3/1993 | Mullins |
| 5,533,790 A | 7/1996 | Weiland |
| 5,607,205 A | 3/1997 | Burdick et al. |
| 5,629,626 A | 5/1997 | Russell et al. |
| 5,644,237 A | 7/1997 | Eslambolchi et al. |
| 5,657,756 A | 8/1997 | Vrba et al. |
| 5,696,490 A | 12/1997 | Maloney |
| 5,735,352 A | 4/1998 | Henderson et al. |
| 5,786,696 A | 7/1998 | Weaver |
| 5,801,530 A | 9/1998 | Crosby et al. |
| 5,835,053 A | 11/1998 | Davis |
| 6,119,376 A | 9/2000 | Stump |
| 6,152,648 A | 11/2000 | Gfroerer et al. |
| 6,164,385 A | 12/2000 | Buchl |
| 6,371,566 B1 | 4/2002 | Haehn |
| 6,456,079 B2 | 9/2002 | Ott et al. |
| 6,477,795 B1 | 11/2002 | Stump |
| 6,559,645 B2 | 5/2003 | Arndt et al. |
| 6,657,577 B1 | 12/2003 | Gregersen et al. |
| 6,664,914 B2 | 12/2003 | Longstaff et al. |
| 6,700,526 B2 | 3/2004 | Witten |

(Continued)

FOREIGN PATENT DOCUMENTS

CN 1455049 A 11/2003

(Continued)

*Primary Examiner* — Reena Aurora
(74) *Attorney, Agent, or Firm* — Phillip W. Townsend, III

(57) ABSTRACT

In one aspect of the present invention a method of determining a distance to a ferrous material comprises providing a plurality of magnetometers spaced at varying distances from a ferrous material, detecting a ferrous material with each of the plurality of magnetometers individually, establishing one of the plurality of magnetometers as a primary magnetometer, obtaining sensor readings from each of the plurality of magnetometers, forming a first ratio of the differences in the sensory readings of the primary magnetometer to the sensory readings of the other magnetometers, forming a second ratio of the differences in inversely cubed distances to the ferrous material from the primary magnetometer to inversely cubed distances to the ferrous material from the other magnetometers, setting the first ratio and the second ratio equal to each other, and calculating the distance to the ferrous material from the plurality of magnetometers.

20 Claims, 7 Drawing Sheets

U.S. PATENT DOCUMENTS

| | | |
|---|---|---|
| 6,701,647 B2 | 3/2004 | Stump |
| 6,724,191 B1 | 4/2004 | Larsen |
| 6,870,370 B2 | 3/2005 | Bryan |
| 6,879,161 B2 | 4/2005 | Rowan |
| 6,916,070 B2 | 7/2005 | Sehr |
| 6,921,230 B2 | 7/2005 | Silay |
| 6,967,574 B1 | 11/2005 | Nelson |
| 7,029,199 B2 | 4/2006 | Mayfield et al. |
| 7,075,293 B2 | 7/2006 | Sporl et al. |
| 7,077,601 B2 | 7/2006 | Lloyd |
| 7,123,016 B2 | 10/2006 | Larsen |
| 7,126,323 B1 | 10/2006 | Larsen |
| 7,178,606 B2 | 2/2007 | Pecchio |
| 7,265,551 B2 | 9/2007 | Kellermann |
| 7,310,586 B2 | 12/2007 | Stametescu et al. |
| 7,355,409 B2 | 4/2008 | Larsen |
| 7,372,247 B1 | 5/2008 | Giusti et al. |
| 7,677,672 B2 | 3/2010 | Hall |
| 7,717,521 B2 | 5/2010 | Hall |
| 2008/0185903 A1 | 8/2008 | Bausov et al. |
| 2009/0041542 A1 | 2/2009 | Hall |

FOREIGN PATENT DOCUMENTS

| | | |
|---|---|---|
| JP | 03241105 A | 10/1991 |

METHOD OF DETERMINING DISTANCE TO A FERROUS MATERIAL

BACKGROUND OF THE INVENTION

There exists a variety of methods which use gradiometers to determine the magnetic field gradient of a system. Gradiometers comprise a plurality of magnetometers separated by a fixed distance. Magnetometers measure the strength and direction of the ambient magnetic field as well as magnetic fields from other sources, such as ferrous materials. The prior art discloses said methods using gradiometers.

One such method using gradiometers is disclosed in U.S. Pat. No. 5,122,744 to Koch, which is herein incorporated by reference for all that it contains. Koch discloses a gradiometer which utilizes at least three vector magnetometers (preferably SQUIDs) to measure a magnetic field gradient. The gradiometer includes a reference magnetometer and a plurality of sensor magnetometers, wherein the reference magnetometer (SQUID) is used to cancel background magnetic fields from outputs of the sensor magnetometers, via a feedback loop provided with a signal from the reference magnetometer. Similarly, higher order gradiometers can be built using a reference magnetometer cube and a plurality of sensor magnetometer cubes.

Another such method using gradiometers is disclosed in U.S. Pat. No. 5,657,756 to Vrba et al., which is herein incorporated by reference for all that it contains. Vrba et al. discloses a method and system of obtaining magnetic measurements with a preselected order of sensor gradiometer which are substantially equivalent to those which would be obtained with a sensor gradiometer of a higher order. The system and method employs a reference system comprising reference tensor gradiometers and appropriate components of a measured tensor are combined with the measurements obtained from the sensor gradiometer to obtain a magnetic measurement substantially equivalent to that which would have been measured by a higher order sensor gradiometer.

BRIEF SUMMARY OF THE INVENTION

In one aspect of the present invention a method of determining a distance to a ferrous material comprises providing a plurality of magnetometers spaced at varying distances from a ferrous material, detecting a ferrous material with each of the plurality of magnetometers individually, establishing one of the plurality of magnetometers as a primary magnetometer, obtaining sensor readings from each of the plurality of magnetometers, forming a first ratio of the differences in the sensory readings of the primary magnetometer to the sensory readings of the other magnetometers, forming a second ratio of the differences in inversely cubed distances to the ferrous material from the primary magnetometer to inversely cubed distances to the ferrous material from the other magnetometers, setting the first ratio and the second ratio equal to each other, and calculating the distance to the ferrous material from the plurality of magnetometers.

The method may further comprise determining a relative strength of a magnetic field of the ferrous material and a relative strength of an ambient magnetic field.

The step of spacing the plurality of magnetometers may comprise spacing the plurality of magnetometers vertically with respect to one another. The plurality of magnetometers may be spaced such that each magnetometer of the plurality of magnetometers detects at least 10 percent of the sensor reading due to a magnetic field from the ferrous material of a magnetometer disposed closest to the ferrous material.

The step of providing a plurality of magnetometers may comprise providing a plurality of horizontal arrays comprising pluralities of vertically spaced magnetometers. The plurality of horizontal arrays may be positioned side by side or may be overlapping each other. Providing a plurality of horizontal arrays may further comprise determining a size and a location of an edge of the ferrous material.

A virtual magnetometer may be provided from two horizontally adjacent magnetometers on a horizontal array. The sensor reading of the virtual magnetometer may be determined by summing the sensor readings from the two horizontally adjacent magnetometers and then dividing the sum by the total number of sensor readings that are being summed. The sensor reading of the virtual magnetometer may also be determined by summing each of the sensor readings from the two horizontally adjacent magnetometers multiplied by the total distance between the adjacent magnetometers minus the distance to the virtual magnetometer from that magnetometer and then dividing the entire sum by the total distance. Another method of determining the sensor reading of the virtual magnetometer may be by forming a cubic function based on restrictions that the cubic function passes through the sensory reading of a first magnetometer of the two horizontally adjacent magnetometers, has a slope at the sensory reading of the first magnetometer equal to a slope passing through the sensory readings of a magnetometer horizontally adjacent to the first magnetometer and a second magnetometer of the two horizontally adjacent magnetometers, passes through the sensory reading of the second magnetometer, and has a slope at the sensory reading of the second magnetometer equal to a slope passing through the sensory readings of a magnetometer horizontally adjacent to the second magnetometer and the first magnetometer.

The step of providing a plurality of magnetometers may comprise at least one magnetometer comprising a single metallic coil and at least one fluxgate magnetometer. The plurality of magnetometers may be disposed on a printed circuit board.

The step of obtaining sensor readings from each of the plurality of magnetometers may comprise obtaining sensor readings of an absolute magnetic field which may comprise the sum of readings from the magnetic field of the ferrous material and readings from an ambient magnetic field.

The step of calculating the distance to the ferrous material from the plurality of magnetometers may comprise calculating the distance to the ferrous material from a magnetometer of the plurality of magnetometers disposed closest to the ferrous material.

The method may further comprise disposing a magnetic shielding device partially around the plurality of magnetometers to block ambient magnetic fields.

DETAILED DESCRIPTION OF THE INVENTION AND THE PREFERRED EMBODIMENT

Figure 1:
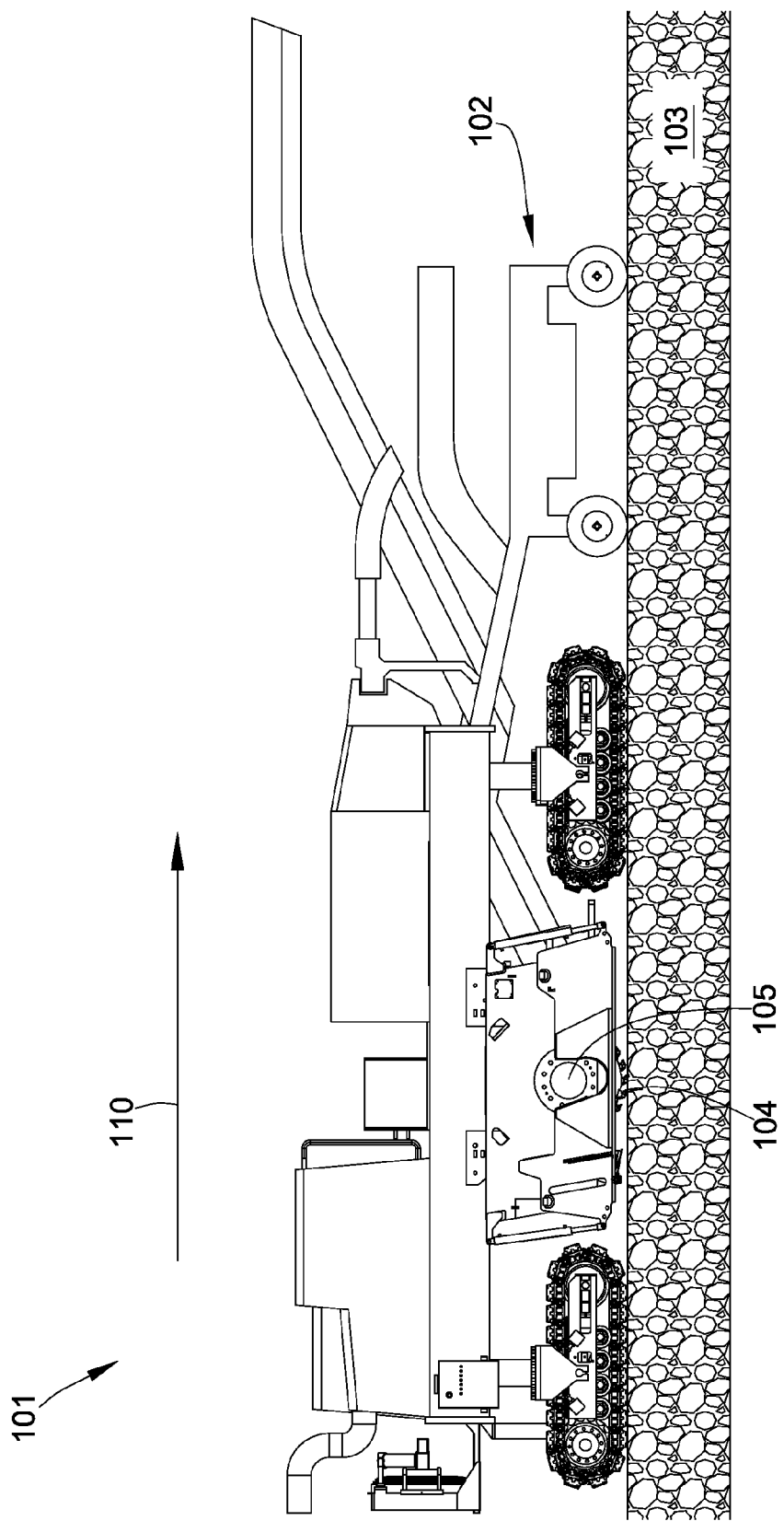
FIG. 1 is an orthogonal view of an embodiment of a pavement milling machine.

Referring now to the figures, FIG. 1 discloses an embodiment of a milling machine 101. The milling machine 101 may comprise a planer used to degrade man-made formations 103 such as pavement, concrete or asphalt prior to placement of a new layer. The milling machine 101 may comprise a plurality of degradation assemblies 104 attached to a driving mechanism 105. The milling machine 101 may further comprise a wagon 102 comprising a plurality of sensors for detection purposes during normal milling operations. The wagon 102 may comprise a plurality of magnetometers to detect ferrous materials. The arrow 110 shows the machines direction of travel.

Figure 2:
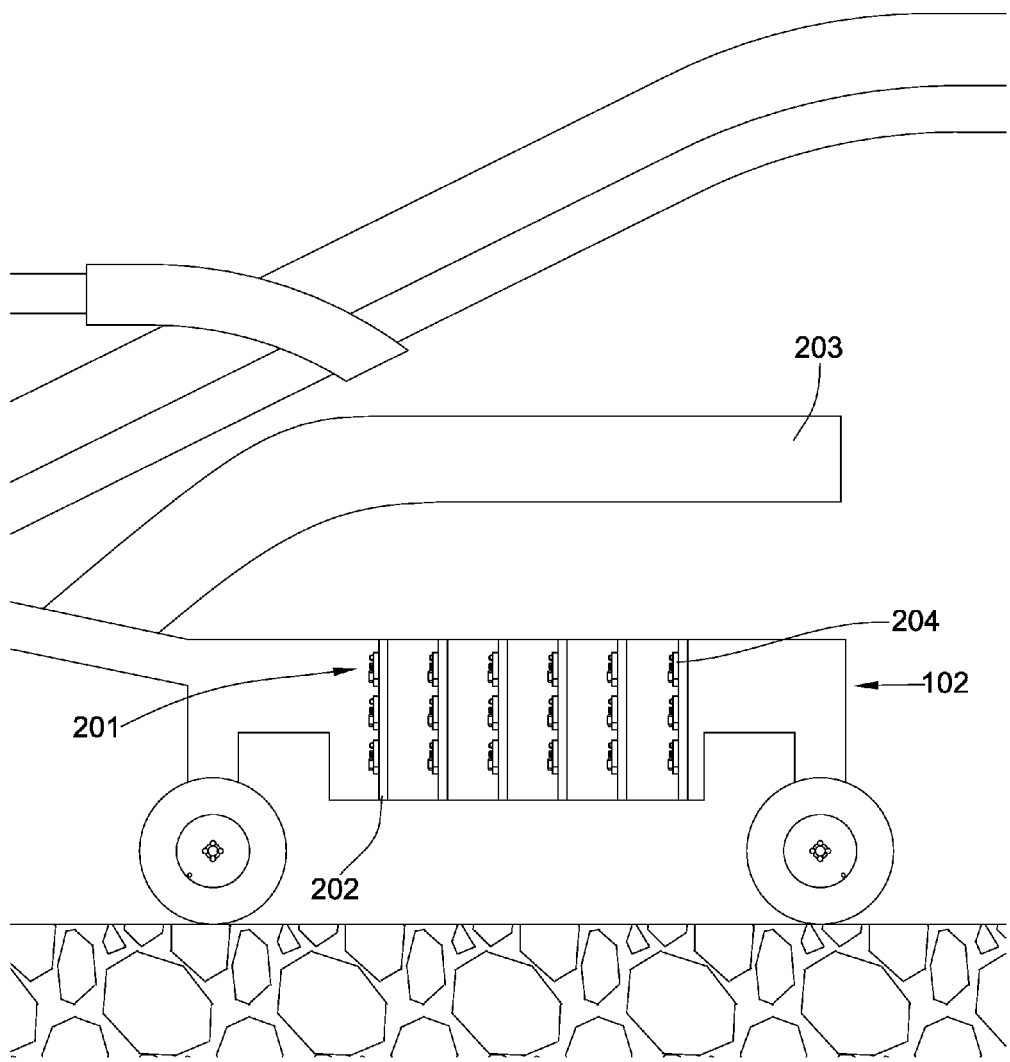
FIG. 2 is a cross-sectional view of an embodiment of a wagon.

FIG. 2 discloses a cross-sectional view of an embodiment of the wagon 102 comprising a plurality of magnetometers 201. The plurality of magnetometers 201 may be disposed in arrays 202 which may be positioned so that they are overlapping each other as shown in this embodiment. A magnetic shielding device 203 may be disposed partially around the wagon 102. The magnetic shielding device 203 may block ambient magnetic noise from the milling machine. Each magnetometer 204 of the plurality of magnetometers 201 may detect an absolute magnetic field, which may comprise an ambient magnetic field and the magnetic field from a ferrous material, and the magnetic shielding device 203 may substantially cancel out ambient magnetic noise generated from the milling machine.

Figure 3:
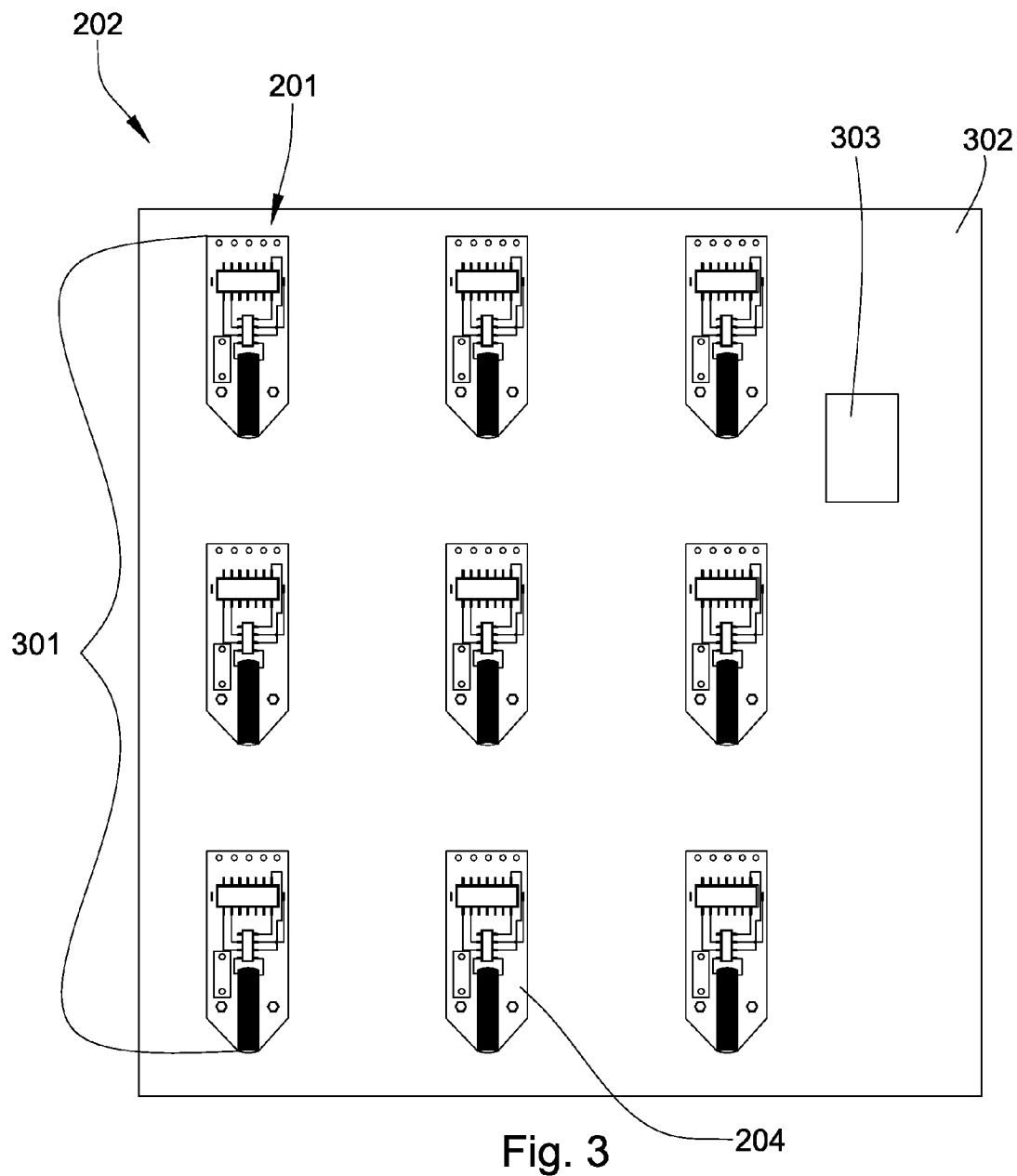
FIG. 3 is an orthogonal view of an embodiment of an array of magnetometers.

FIG. 3 discloses an embodiment of an array 202 comprising a plurality of magnetometers 201. The plurality of magnetometers 201 may comprise at least three magnetometers 301. The plurality of magnetometers 201 may be disposed vertically with respect to one another. It is believed that at least three magnetometers 301 vertically spaced with respect to one another may allow the distance from the plurality of magnetometers 201 to a ferrous material to be determined. The array 202 may comprise a horizontally spaced plurality of vertically spaced pluralities of magnetometers 201. The array 202 may be disposed on a printed circuit board 302 which may comprise a controller 303. It is believed that the printed circuit board 302 simplifies the electrical connections to the plurality of magnetometers 201 and aids in maintaining consistent distances between each magnetometer 204. The controller 303 may digitize analog values so that sensor readings can be processed by an information processor.

It is known in the art that a gradiometer is comprised of a plurality of magnetometers, usually two magnetometers, separated by a fixed distance. The gradiometer may measure the gradient of a magnetic field at a location by determining the strength of the absolute magnetic field at the locations of surrounding magnetometers. For information regarding one embodiment of a gradiometer, the reader is referenced to the Koch patent, U.S. Pat. No. 5,122,744 which is herein incorporated by reference for all that it contains. The Koch patent discloses a plurality of sensor magnetometers each producing an output and a reference magnetometer generating a reference output. The reference output cancels a background magnetic field from the respective outputs of the sensor magnetometers to produce a plurality of cancelled sensor magnetometer outputs. A magnetic field gradient is provided by performing magnetic subtraction on the cancelled sensory magnetometer outputs.

In the present invention, each magnetometer 204 of the plurality of magnetometers 201 may detect the absolute magnetic field. A distance from the plurality of magnetometers 201 to a ferrous material may be determined by comparing the readings of each of the magnetometers 204 of the plurality of magnetometers 201. It is believed that because each magnetometer 204 may detect the absolute magnetic field, then the plurality of magnetometers 201 may be spaced in close proximity with one another. The spacing of the plurality of magnetometers may be such that each magnetometer 204 of the plurality of magnetometers 201 detects at least 10 percent of the sensor reading due to a magnetic field of the ferrous material from a magnetometer disposed closest to the ferrous material.

Figure 4:
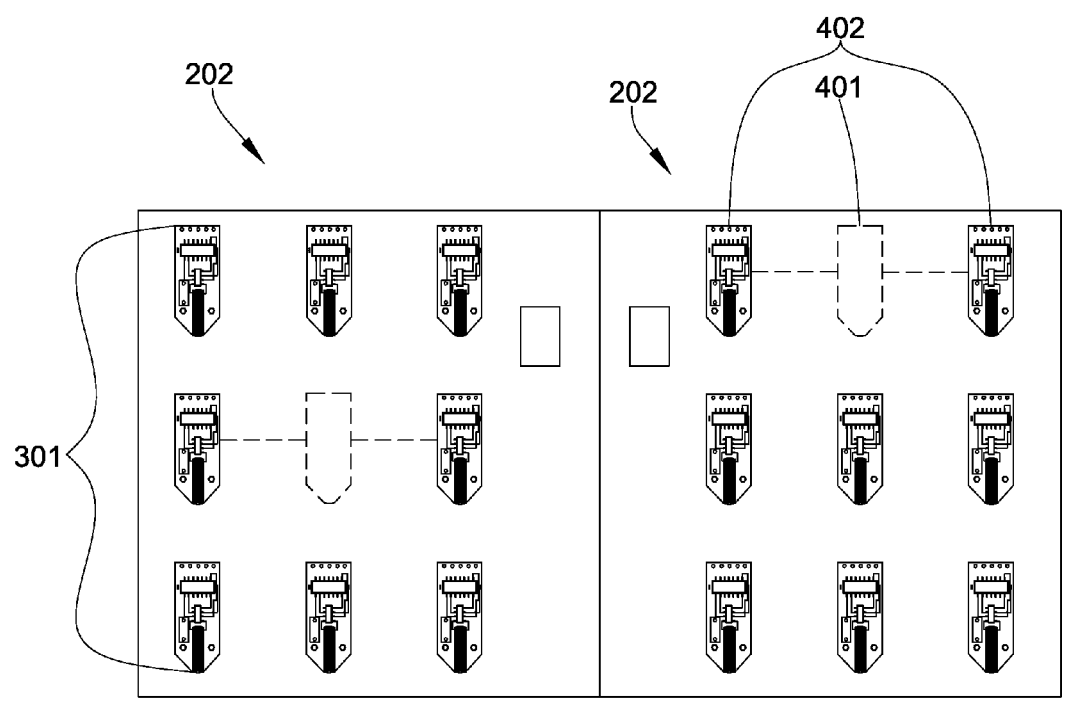
FIG. 4 is an orthogonal view of an embodiment of a plurality of arrays of magnetometers.

FIG. 4 discloses a plurality of horizontal arrays 202 positioned side by side. It is believed that positioning the horizontal arrays 202 side by side and overlapping may increase the detection area for finding a ferrous material. This embodiment also discloses a virtual magnetometer 401 formed between two horizontally adjacent magnetometers 402 on a horizontal array 202. As discussed previously, at least three magnetometers 301 may be used to determine a distance to a ferrous material. A horizontal array 202 may comprise a plurality of vertically spaced at least three magnetometers 301. A virtual magnetometer 401 may comprise the absence of a physical magnetometer and may exist when two horizontally adjacent magnetometers 402 exist. The two horizontally adjacent magnetometers 402 may compensate for an absent magnetometer and a distance to the ferrous material may still be determined. The sensor reading of the virtual magnetometer may be determined by summing the sensor readings from the two horizontally adjacent magnetometers and then dividing the sum by the total number of sensor readings that are being summed. The sensor reading of the virtual magnetometer may also be determined by summing each of the sensor readings from the two horizontally adjacent magnetometers multiplied by the total distance between the adjacent magnetometers minus the distance to the virtual magnetometer from that magnetometer and then dividing the entire sum by the total distance. Another method of determining the sensor reading of the virtual magnetometer may be by forming a cubic function based on restrictions that the cubic function passes through the sensory reading of a first magnetometer of the two horizontally adjacent magnetometers, has a slope at the sensory reading of the first magnetometer equal to a slope passing through the sensory readings of a magnetometer horizontally adjacent to the first magnetometer and a second magnetometer of the two horizontally adjacent magnetometers, passes through the sensory reading of the second magnetometer, and has a slope at the sensory reading of the second magnetometer equal to a slope passing through the sensory readings of a magnetometer horizontally adjacent to the second magnetometer and the first magnetometer.

Figure 5:
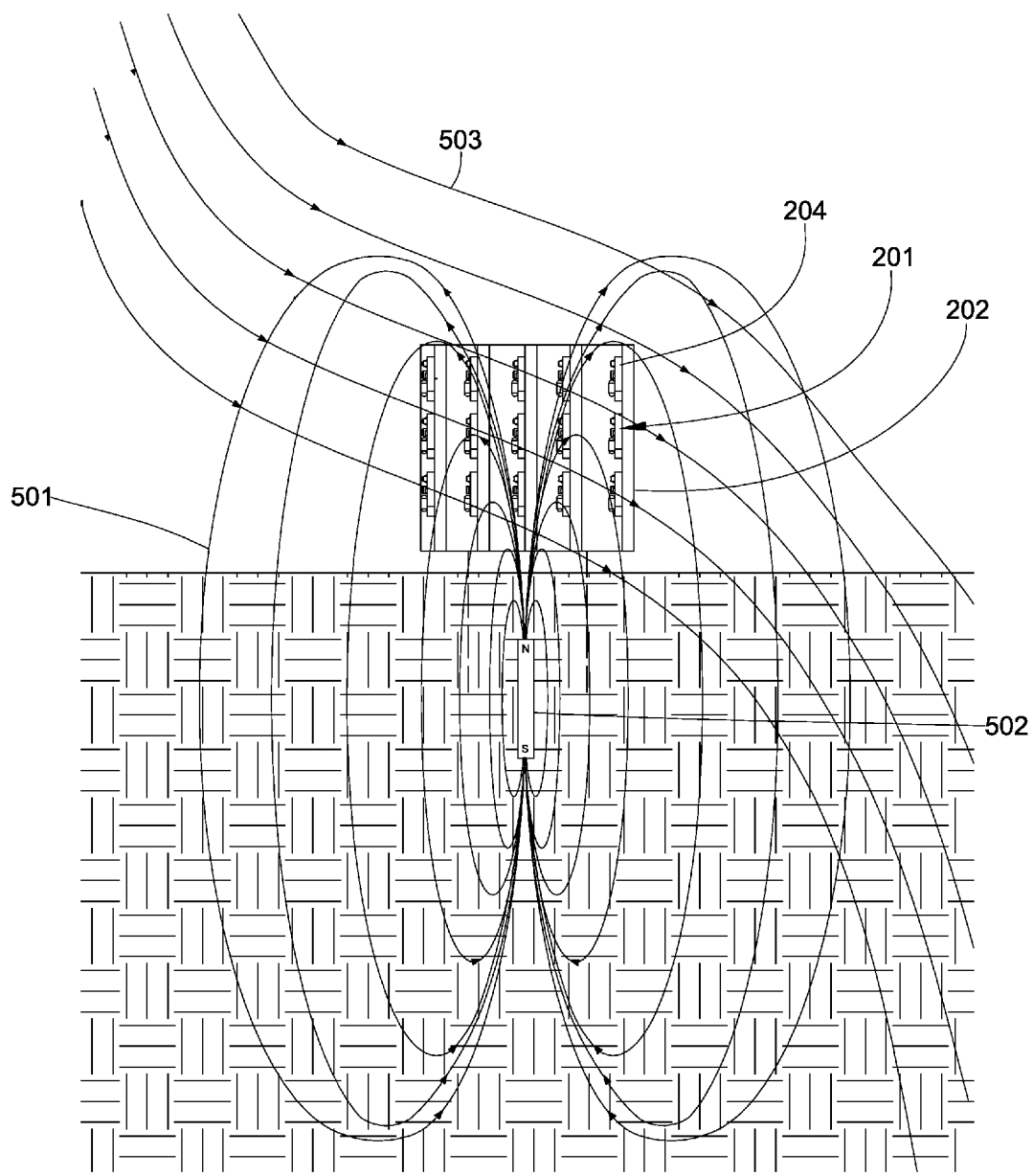
FIG. 5 is a representation of an embodiment of a magnetic field of a ferrous material and an ambient magnetic field.

FIG. 5 discloses a representation of an embodiment of a magnetic field 501 of a ferrous material 502 and an ambient magnetic field 503. Each magnetometer 204 may detect the absolute magnetic field which may comprise the sum of the magnetic field 501 of the ferrous material 502 and the ambient magnetic field 503. In this embodiment the plurality of horizontal arrays 202 each comprise a plurality of magnetometers 201 that may determine the size and the location of the edges of the ferrous material 502. Knowing the size and location of the edges may be significant when deciding a course of action to deal with the ferrous material 502.

Figure 6:
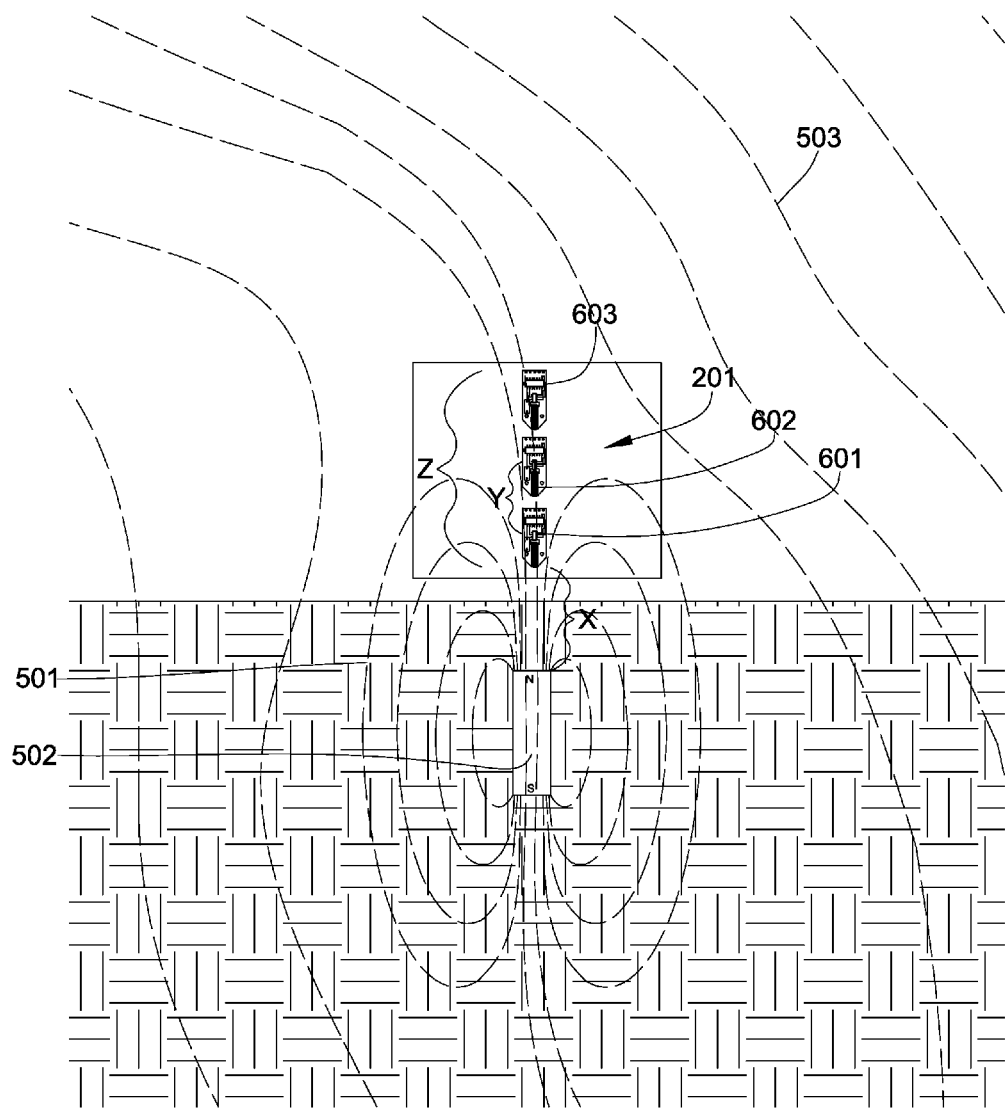
FIG. 6 is a representation of an embodiment of an absolute magnetic field and a position of a plurality of magnetometers relative to a ferrous material.

FIG. 6 discloses a representation of an embodiment of the absolute magnetic field and the position of a plurality of magnetometers 201 relative to a ferrous material 502. The distance X from the plurality of magnetometers 201 to the ferrous material 502 may be calculated relative to the magnetometer 601 disposed closest to the ferrous material 502. The magnetometer 602 may be spaced a distance Y away from the magnetometer 601 so that the distance Y plus the distance X equals the distance from the magnetometer 602 to the ferrous material 502. The magnetometer 603 may be spaced a distance Z away from the magnetometer 601 so that the distance Z plus the distance X equals the distance from the magnetometer 603 to the ferrous material 502. A sensor reading A may be obtained from the magnetometer 601, a sensor reading B may be obtained from the magnetometer 602 and a sensor reading C may be obtained from the magnetometer 603. It is believed that the strength of the magnetic field 501 of the ferrous material 502 measured at a given distance and that distance have an inversely cubed relationship. An equation (1) relating the sensor reading A of the magnetometer 601 to the distance X from the magnetometer 601 to the ferrous material 502 may be formed:

$$A = S/X^3 + F \quad (1)$$

where S describes the relative strength of the magnetic field 501 of the ferrous material 502 and F describes the relative strength of an ambient magnetic field 503. An equation (2) relating the sensor reading B of the magnetometer 602 to the distance X from the magnetometer 601 to the ferrous material 502 and an equation (3) relating the sensor reading C of the magnetometer 603 to the distance X from the magnetometer 601 to the ferrous material 502 may also be formed:

$$B = S/(X+Y)^3 + F \quad (2)$$

and $$C = S/(X+Z)^3 + F. \quad (3)$$

It is believed that the relative strength S of the magnetic field 501 of the ferrous material 502 and the relative strength F of the ambient magnetic field 503 are detected equally by the magnetometer 601, the magnetometer 602, and the magnetometer 603 due to the close proximity of the plurality of magnetometers. Three equations are obtained and may comprise constants: sensor reading A of magnetometer 601, sensor reading B of magnetometer 602, sensor reading C of magnetometer 603, distance Y from magnetometer 602 to magnetometer 601, and distance Z from magnetometer 603 to magnetometer 601. The three equations may also comprise unknowns: distance X from magnetometer 601 to ferrous material 502, relative strength S of the magnetic field 501 of the ferrous material 502, and relative strength F of the ambient magnetic field 503.

One of the plurality of magnetometers 201 may be established as a primary magnetometer. The magnetometer 601 comprising a sensor reading A may be the primary magnetometer for this derivation. Equation (2) may be subtracted from equation (1) to yield equation (4):

$$A - B = S/X^3 - S/(X+Y)^3 \quad (4)$$

and equation (3) may be subtracted from equation (1) to yield equation (5):

$$A - C = S/X^3 - S/(X+Z)^3. \quad (5)$$

Equation (4) may be divided by equation (5) to yield equation (6):

$$(A-B)/(A-C) = (1/X^3 - 1/(X+Y)^3)/(1/X^3 - 1/(X+Z)^3). \quad (6)$$

Equation (6) may comprise a first ratio between the difference in the sensor reading A of the primary magnetometer 601 and the sensor reading B of the magnetometer 602 and the difference in the sensor reading A of the primary magnetometer 601 and the sensor reading C of the magnetometer 603. Equation (6) may also comprise a second ratio between the difference of the distance X to a ferrous material from the primary magnetometer 601 inversely cubed and the distance (X+Y) to a ferrous material from the magnetometer 602 inversely cubed and the difference of the distance X to a ferrous material from the primary magnetometer 601 and the distance (X+Z) to a ferrous material from the magnetometer 603 inversely cubed. The first ratio and the second ratio may be set equal to each other and the distance X to the ferrous material from the magnetometer 601 may be calculated due to one equation and one unknown.

The relative strength S of the magnetic field 501 of the ferrous material 502 and the relative strength F of the ambient magnetic field 503 may also be determined once the distance has been calculated. The relative strength S of the magnetic field 501 of the ferrous material 502 may be calculated by either equation (4) or equation (5). The relative strength F of the ambient magnetic field 503 may be calculated by equation (1), or equation (2), or equation (3).

Figure 7:
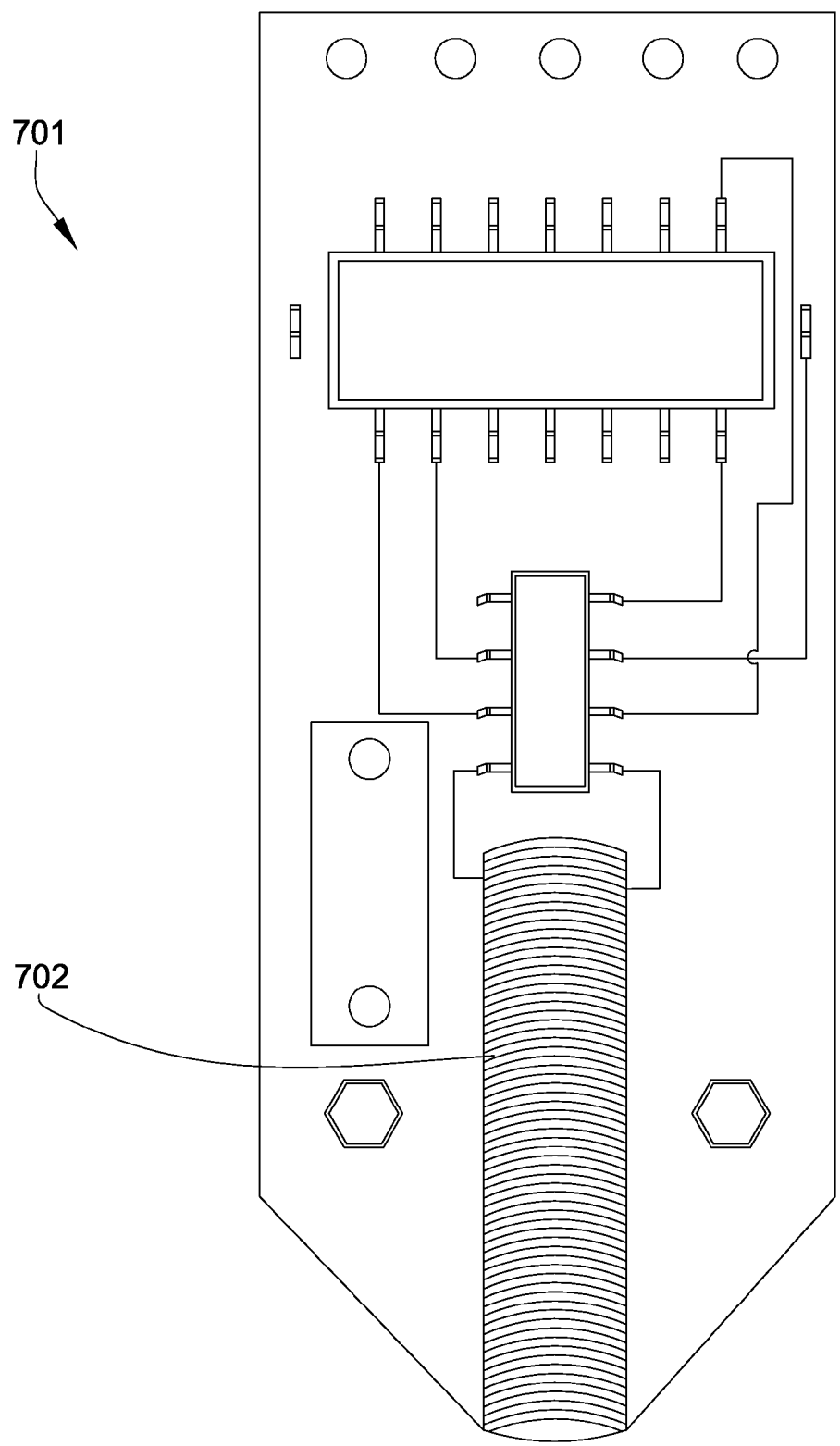
FIG. 7 is an orthogonal view of an embodiment of a magnetometer.

FIG. 7 discloses an embodiment of a magnetometer 701. The magnetometer 701 may comprise a single metallic coil 702. It is believed that as the single metallic coil 702 detects a magnetic field a current is generated. The magnetometer 701 may be a fluxgate magnetometer. It is believed that fluxgate magnetometers are passive which may allow positioning a plurality of fluxgate magnetometers in an array because they won't interfere with each other.

Whereas the present invention has been described in particular relation to the drawings attached hereto, it should be understood that other and further modifications apart from those shown or suggested herein, may be made within the scope and spirit of the present invention.

What is claimed is:

1. A method of determining a distance to a ferrous material comprising:

providing a plurality of magnetometers spaced at varying distances from a ferrous material;

detecting a ferrous material with each of the plurality of magnetometers individually;

establishing one of the plurality of magnetometers as a primary magnetometer;

obtaining sensor readings from each of the plurality of magnetometers;

forming a first ratio between the difference in the sensor reading of the primary magnetometer and a sensor reading from a first magnetometer of the plurality of magnetometers and the difference in the sensor reading of the primary magnetometer and a sensor reading from a second magnetometer of the plurality of magnetometers;

forming a second ratio between the difference of a distance to a ferrous material from the primary magnetometer inversely cubed and the distance to a ferrous material from the first magnetometer inversely cubed and the difference of the distance to a ferrous material from the primary magnetometer inversely cubed and the distance to a ferrous material from the second magnetometer inversely cubed;

setting the first ratio and the second ratio equal to each other; and calculating a distance to the ferrous material from the plurality of magnetometers.

2. The method of claim 1, further comprising determining a relative strength of a magnetic field of the ferrous material.

3. The method of claim 1, further comprising determining a relative strength of an ambient magnetic field.

4. The method of claim 1, wherein the spacing of the plurality of magnetometers is vertical with respect to one another.

5. The method of claim 4, wherein providing a plurality of magnetometers comprises providing a plurality of horizontal arrays of pluralities of vertically spaced magnetometers.

6. The method of claim 5, wherein the providing the plurality of horizontal arrays comprises positioning the horizontal arrays side by side.

7. The method of claim 5, wherein the providing the plurality of horizontal arrays comprises positioning the horizontal arrays overlapping each other.

8. The method of claim 5, wherein providing a plurality of magnetometers comprises providing a virtual magnetometer from two horizontally adjacent magnetometers on a horizontal array.

9. The method of claim 8, wherein providing a virtual magnetometer comprises obtaining a sensory reading for the virtual magnetometer by summing the sensor readings from the two horizontally adjacent magnetometers and then dividing the sum by the total number of sensor readings that are being summed.

10. The method of claim 8, wherein providing a virtual magnetometer comprises obtaining a sensory reading for the virtual magnetometer by summing each of the sensor reading from the two horizontally adjacent magnetometers multiplied by the total distance between the adjacent magnetometers minus the distance to the virtual magnetometer from that magnetometer and then dividing the entire sum by the total distance.

11. The method of claim 8, wherein providing a virtual magnetometer comprises obtaining a sensory reading for the virtual magnetometer by forming a cubic function based on restrictions that the cubic function passes through the sensory reading of a first magnetometer of the two horizontally adjacent magnetometers, has a slope at the sensory reading of the first magnetometer equal to a slope passing through the sensory readings of a magnetometer horizontally adjacent to the first magnetometer and a second magnetometer of the two horizontally adjacent magnetometers, passes through the sensory reading of the second magnetometer, and has a slope at the sensory reading of the second magnetometer equal to a slope passing through the sensory readings of a magnetometer horizontally adjacent to the second magnetometer and the first magnetometer.

12. The method of claim 5, further comprising determining a size of the ferrous material from the plurality of horizontal arrays.

13. The method of claim 5, further comprising determining a location of an edge of the ferrous material from the plurality of horizontal arrays.

14. The method of claim 1, wherein the spacing of the plurality of magnetometers is such that each magnetometer of the plurality of magnetometers detects at least 10 percent of the sensor reading due to a magnetic field from the ferrous material of a magnetometer disposed closest to the ferrous material.

15. The method of claim 1, wherein the obtaining sensor readings from each of the plurality of magnetometers comprises obtaining sensor readings of an absolute magnetic field which comprises the sum of readings from the magnetic field of the ferrous material and readings from an ambient magnetic field.

16. The method of claim 1, wherein calculating the distance to the ferrous material from the plurality of magnetometers comprises calculating the distance to the ferrous material from a magnetometer of the plurality of magnetometers disposed closest to the ferrous material.

17. The method of claim 1, wherein the providing a plurality of magnetometers comprises providing at least one magnetometer with a single metallic coil.

18. The method of claim 1, wherein the providing a plurality of magnetometers comprises providing at least one fluxgate magnetometer.

19. The method of claim 1, wherein the providing a plurality of magnetometers comprises disposing the plurality of magnetometers on a printed circuit board.

20. The method of claim 1, further comprising disposing a magnetic shielding device partially around the plurality of magnetometers.

* * * * *